(12) United States Patent
Marmy et al.

(10) Patent No.: US 8,501,584 B2
(45) Date of Patent: Aug. 6, 2013

(54) METHOD OF MANUFACTURING MULTI-LEVEL, SILICON, MICROMECHANICAL PARTS AND PARTS THEREBY OBTAINED

(75) Inventors: Philippe Marmy, Chatillon (CH); Jean-Luc Helfer, Bienne (CH); Thierry Conus, Lengnau (CH)

(73) Assignee: ETA SA Manufacture Horlogère Suisse, Grenchen (CH)

( * ) Notice: Subject to any disclaimer, the term of this patent is extended or adjusted under 35 U.S.C. 154(b) by 468 days.

(21) Appl. No.: 12/514,352

(22) PCT Filed: Nov. 1, 2007

(86) PCT No.: PCT/EP2007/061800
§ 371 (c)(1),
(2), (4) Date: May 11, 2009

(87) PCT Pub. No.: WO2008/055844
PCT Pub. Date: May 15, 2008

(65) Prior Publication Data
US 2010/0054092 A1    Mar. 4, 2010

(30) Foreign Application Priority Data
Nov. 10, 2006    (EP) .................................... 06123873

(51) Int. Cl.
*H01L 21/30* (2006.01)
*H01L 21/46* (2006.01)
*C23F 1/00* (2006.01)
*G04B 15/00* (2006.01)
*G04B 1/00* (2006.01)

(52) U.S. Cl.
USPC ............... 438/455; 216/2; 438/458; 438/459; 368/124; 368/139

(58) Field of Classification Search
USPC ............................................. 216/2
See application file for complete search history.

(56) References Cited

U.S. PATENT DOCUMENTS 5,236,118 A * 8/1993 Bower et al. .................. 228/193
5,266,135 A * 11/1993 Short et al. ..................... 438/455

(Continued)

FOREIGN PATENT DOCUMENTS

EP     732635 A1 * 9/1996
EP     1 674 264 A2    6/2006

(Continued)

OTHER PUBLICATIONS

Mehregany et al. "Micro gears and tubines etched from silicon" 1987 Sensors and Actuators, 12, p. 341-348.*

(Continued)

*Primary Examiner* — Allan Olsen
*Assistant Examiner* — Margaret D Klunk
(74) *Attorney, Agent, or Firm* — Griffin & Szipl, P.C.

(57) ABSTRACT

The process comprises the following steps:
 a) a first element (3) or a plurality of said first elements (3) is/are machined in a first silicon wafer (1) keeping said elements (3) joined together via material bridges (5);
 b) step a) is repeated with a second silicon wafer (2) in order to machine a second element (4), differing in shape from that of the first element (3), or a plurality of said second elements (4);
 c) the first and second elements (3, 4) or the first and second wafers (1, 2) are applied, face to face, with the aid of positioning means (6, 7);
 d) the assembly formed in step c) undergoes oxidation; and
 e) the parts (10) are separated form the wafers (1, 2). Micromechanical timepiece parts obtained according to the process.

7 Claims, 1 Drawing Sheet

U.S. PATENT DOCUMENTS

| | | | | |
|---|---|---|---|---|
| 5,273,205 A | * | 12/1993 | Ju et al. | 438/455 |
| 5,484,073 A | | 1/1996 | Erickson | |
| 6,085,967 A | * | 7/2000 | Grande et al. | 228/212 |
| 6,448,109 B1 | * | 9/2002 | Karpman | 438/108 |
| 6,938,334 B2 | * | 9/2005 | Yu | 29/830 |
| 7,735,216 B2 | * | 6/2010 | Schnabel et al. | 29/740 |
| 2004/0029481 A1 | * | 2/2004 | Gross et al. | 445/23 |
| 2005/0072189 A1 | | 4/2005 | Tudryn et al. | |
| 2006/0037187 A1 | | 2/2006 | Sparks | |

FOREIGN PATENT DOCUMENTS

| | | |
|---|---|---|
| EP | 1674264 A2 * | 6/2006 |
| FR | 2 874 907 A1 | 3/2006 |
| WO | 2005/079128 A1 | 8/2005 |

OTHER PUBLICATIONS

W. Noell et al. "MEMS for watches", 2004, 17th IEEE International Conference on Micro Electro Mechanical Systems, p. 1-4.*

Semiconductors devices: physics and technology—Oxidation and Film Deposition (ed. John Wiley & Sons, ISBN 0-471-87424-8, 01.01 1985, p. 341-380).

International Search Report issued in corresponding application No. PCT/EP2007/061800, completed Feb. 29, 2008 and mailed Mar. 10, 2008.

International Preliminary Examination Report issued in corresponding application No. PCT/EP2007/061800, completed Feb. 18, 2009.

Semiconductor International Nov. 2003, Wafer Bonding Enables New Technologies and Applications, Laura Peters, Senior Editor—Nov. 1, 2003, 6 pages, downloaded from http://www.tf.uni-kiel.de/matwis/amat/semi_en/running_term/articles . . . on Jan. 18, 2012.

* cited by examiner

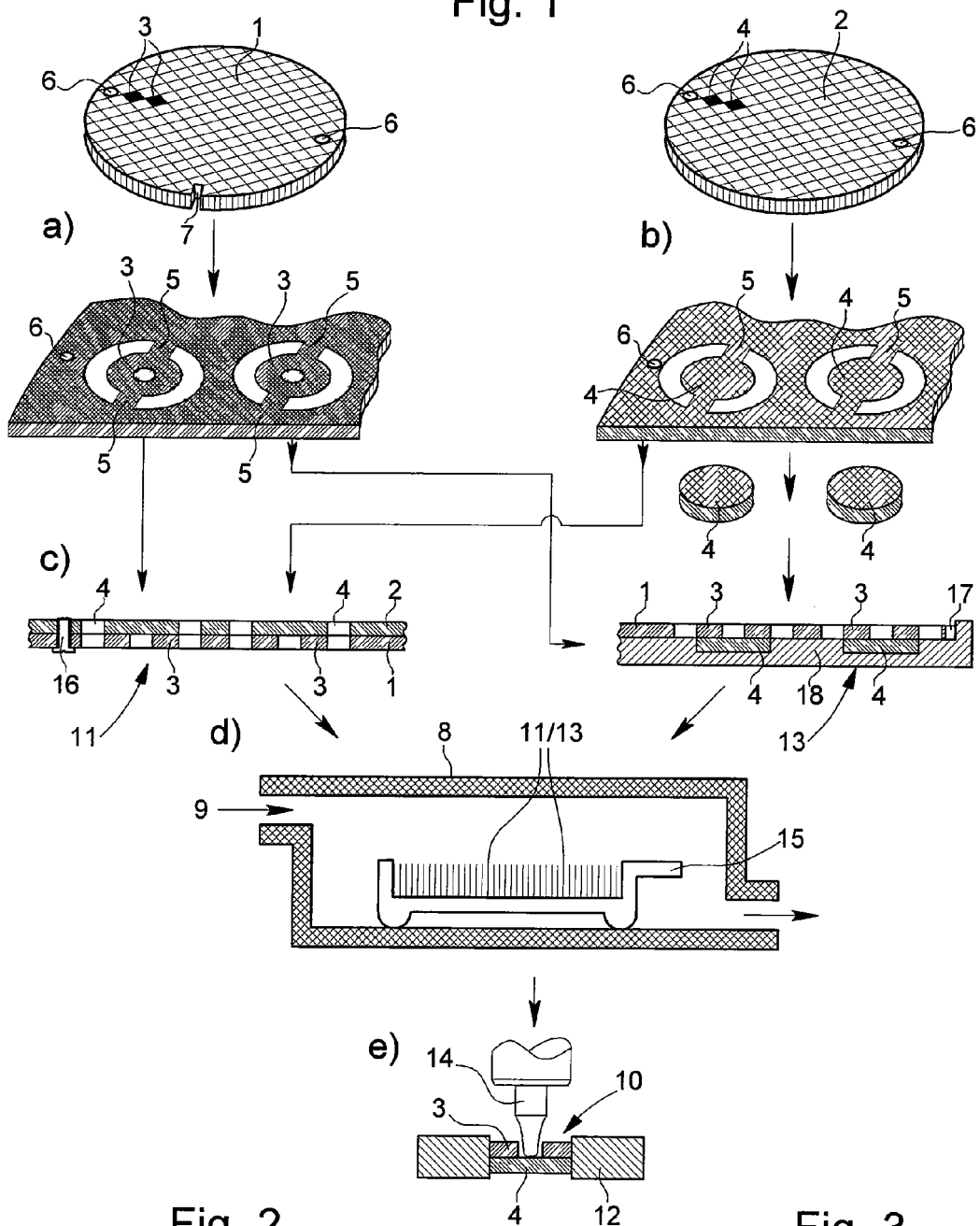

METHOD OF MANUFACTURING MULTI-LEVEL, SILICON, MICROMECHANICAL PARTS AND PARTS THEREBY OBTAINED

This is a National Phase Application in the United States of International Patent Application No. PCT/EP2007/061800 filed Nov. 1, 2007, which claims priority on European Patent Application No. 06123873.9, filed Nov. 10, 2006. The entire disclosures of the above patent applications are hereby incorporated by reference.

FIELD OF THE INVENTION

The present invention concerns a method of manufacturing multi-level, silicon, micromechanical parts and the parts thereby obtained, used in particular within the field of the watchmaking industry.

BACKGROUND OF THE INVENTION

Current techniques for manufacturing silicon, micromechanical parts allow the verticality of the sides of the parts to be sufficiently well controlled for the part to be used as a timepiece mechanism component. However, it remains very difficult to manufacture multi-level parts from a single silicon wafer, using current techniques.

An alternative method of producing multi-level parts is proposed here. This method discloses how to obtain multi-level, silicon parts solely from single level silicon parts using current methods.

SUMMARY OF THE INVENTION

It is thus an object of the present invention to provide a simple and economic solution for manufacturing multi-level, micromechanical parts from silicon wafers available on the market, said parts, whether they be fixed or mobile, being used in particular for making a timepiece movement.

The invention therefore concerns a method consisting in:
a) machining a first element or a plurality of said first elements in a first silicon wafer by chemical or physical means or a combination of the two on the same wafer;
b) repeating step a) with a second silicon wafer for machining a second element, of different shape to that of the first element, or a plurality of said second elements on the same wafer;
c) using positioning means, placing the first and second elements or the first and second wafers face to face against each other;
d) performing heat oxidation of the assembly formed in step c) in the presence of an oxidising agent for approximately 2 to 4 hours, and
e) separating the parts.

This method structures each element of the final part with precision, using proven techniques for wafers whose thickness is less than 1 mm.

In step c) various positioning means are possible to ensure precise positioning of the two elements that will form the final part, prior to performing heat oxidation to connect the two elements physically to each other. In the following detailed description, two examples are given of positioning means, which rely either on marking means, which are formed in each wafer at the same time that the elements are structured, with the elements then being linked by bridges of material; or by using a template for positioning the wafers on top of each other or elements that are separate from the wafers.

Step d) of oxidising the interface between the wafers can be performed by a dry method with dry oxygen, or by a wet method with water vapour, for example in a furnace heated to a temperature of between 900° C. and 1200° C. in accordance with techniques that are well known to those skilled in the art and reported for example in the work, "Semiconductor devices: physics and technology—editions John Wiley & Sons, ISBN 0-471-874-8-01.01.1985 p. 341-355".

This oxidation can also be performed by any other method known to those skilled in the art, for example by laser amplified oxidation.

It is also possible to obtain a part that has more than two levels by machining a third silicon wafer that can be integrated in step c) of the method, or after step e) by repeating steps c), d) and e).

The method according to the invention makes it easy to manufacture multi-level, silicon, micromechanical parts, such as bearings, plates or slotted bridges, reduction wheel sets for a timepiece movement, etc. . . .

BRIEF DESCRIPTION OF THE DRAWINGS

Other features and advantages of the present invention will appear more clearly in the following description of example embodiments, given by way of non-limiting illustration, with reference to the annexed drawings, in which:

FIG. 1 is a schematic diagram of the steps of the method for obtaining a bearing with a jewel hole and endstone, FIG. 2 shows another bearing that can be obtained via the method, and FIG. 3 shows a reduction wheel set that can be obtained via the method.

DETAILED DESCRIPTION OF THE INVENTION

FIG. 1 is a schematic diagram of the steps of the method for obtaining a silicon bearing 10, a first element 3 of which forms the "jewel hole" and a second element 4 of which forms the "endstone". Typically, the dimensions of these jewels are comprised between 0.12 and 0.35 mm as regards thickness and between 0.70 and 1.80 mm as regards diameter.

In a first step a) the first element 3, but preferably a plurality of said first elements 3, are machined in a first silicon wafer 1. In fact, starting with a commercially available silicon wafer, whose diameter may vary from between 75 mm to approximately 300 mm, it is possible to structure a plurality of elements having a diameter of less than 2 mm. The thickness of this wafer is generally less than 1 mm, which is compatible with timepiece dimensions, but this thickness may be brought to the precise desired dimension by etching. Preferably, it will be ensured that one surface of the wafer remains unpolished, whether the wafer is sold like this or subjected to a slight abrasive treatment.

Elements 3 are structured in wafer 1 by methods known to those skilled in the art by photolithography and etching through the mask formed. The etching can be carried out in accordance with various methods that are also known within the field of silicon machining. The method that provides the best aspect ratio, i.e. sides cut perpendicular to the surface of the part, is the RIE technique (Reactive Ion Etching).

Since this technique, and the adaptations necessary for each particular case, is well known to those skilled in the art, it will not be described further here.

In this first step, bridges of material 5 are provided to hold elements 3 connected to their support wafer 1. This structuring also forms elements in wafer 1 for positioning said wafer 1 relative to wafer 2. By way of example, these positioning means are formed by two bores 6, with the reference 7 designating other positioning means that will be explained below.

It is clear that bridges of material 5 between the elements of each wafer are not necessarily required depending upon the position used.

In step b), the same process as in step a) is used from a second wafer 2 to form second elements 4, namely the "endstone", and positioning means 6, which coincide with positioning means 6 of the first wafer. In this example, elements 3 and 4 have the same diameter.

When wafers 1 and 2 used in steps a) and b) have at least one unpolished surface, they can be assembled without any prior surface treatment by placing the unpolished surfaces against each other. If the two surfaces of each wafer are polished, a prior surface treatment will preferably be carried out to make the surfaces that will have to be placed against each other either slightly rough, or coated with a silicon oxide film that is slighter thicker than the native oxide.

Step c), as shown in the left part of the diagram, consists in positioning the two wafers 1, 2 one on top of the other and securing this position for example by means of pins 16 to form an assembly 11.

The right part of the diagram illustrates a second positioning example. The second elements 4 are first of all separated from second wafer 2 by breaking bridges of material 5, or they are obtained without any bridges of material 5, then positioned in corresponding slots of a quartz template 18. The first wafer 1 is then applied by being positioned using a slot 7 machined in the edge thereof, said slot 7 engaging in a snug 17 of template 18 to form an assembly 13. By using a template 18 that has slots of suitable depth, the first elements 3 can also be separated from the first wafer 1 to be placed in template 18.

In step d) a series of assemblies 11 or 13 is placed on a carriage 15, which is introduced into a furnace 8 heated to a temperature of between 900° C. and 1200° C. and in which an oxidising mixture 9 circulates for around 2 to 4 hours. This oxidising step, which will connect the two wafers 1 and 2 by siloxane type connections can be performed, either by a dry method with a mixture containing an inert carrier gas and dry oxygen, or by a wet method replacing oxygen with water vapour.

At the end of this step, carriage 15 is removed from furnace 8, assemblies 11 or 13 are allowed to return to ambient temperature, then the parts 10 thereby formed are separated by breaking any residual bridges of material 5. The bearing 10 thus obtained is then ready to be used by being mounted in a setting 12, to receive a pivot 14 of a timepiece movement wheel set.

FIG. 2 shows an alternative embodiment in which jewels 3, 4 of bearing 20 do not have the same diameter. In this case, the method variant that employs a template 18 will preferably be used, said template advantageously being formed of multistage slots that can both stack elements 3 and 4 and position them relative to each other.

FIG. 3 shows another part 30 that can be obtained according to the method of the invention. This is a reduction wheel set formed by an assembly wherein element 3 is the pinion and element 4 the toothed wheel, with an arbour hole 29 passing through the two elements 3 and 4.

The examples that have just been described concern the manufacture of a micromechanical part with two levels, but it is clear that there could be a larger number of levels. In order to do this, one need only start with three or more silicon wafers, or repeat the method at the end of step e).

The invention is not limited to the examples that have just been described and those skilled in the art can implement the method to obtain other micromechanical parts.

The invention is not limited to parts of small dimensions either. It may advantageously be implemented for parts of larger dimensions, such as timepiece movement plates or bridges including recesses. The thickness of such parts is of the order of 2 mm and they could not be made from a single commercially available silicon wafer.

The invention claimed is:

1. A method of manufacturing a monocrystaline or polycrystalline silicon micromechanical part of a timepiece movement with at least two levels, the method including the steps of:
   a) machining, by chemical means, a first element of the silicon micromechanical part or a plurality of said first elements in a first silicon wafer and at least one slot on edge of the first wafer;
   b) machining a second element, of a different shape to that of the first element, or a plurality of said second elements in a second silicon wafer;
   c) separating the second elements from the second wafer;
   d) positioning the second elements in a quartz template, wherein the quartz template has a recess and at least one rib;
   e) forming an assembly by positioning the first wafer in the recess of the quartz template by engaging the at least one slot formed on edge of the first wafer to the corresponding rib of the quartz template so that the first and second elements are placed face to face against each other;
   f) performing heat oxidation of the assembly formed in step e), and
   g) separating the silicon micromechanical part or parts from the first wafer.

2. The method according to claim 1, wherein the first and second elements are held on the first and second wafers, respectively, by bridges of material.

3. The method according to claim 1, wherein the assembly is oxidized in step f) in a furnace heated to a temperature of between 900° C. and 1200° C. in presence of an oxidising mixture for approximately 2 to 4 hours.

4. The method according to claim 1, wherein surfaces of the first and second elements that have to be placed against each other in step e) are oxidized beforehand.

5. The method according to claim 1, wherein surfaces of the first and second elements that have to be placed against each other in step e) undergo prior treatment that gives the surfaces a certain roughness.

6. The method according to claim 1, wherein it further includes at least one additional step of machining at least a third wafer to form a third element or a plurality of third elements assembled with the first and second elements in steps e), f), and g) so that a silicon micromechanical part of a timepiece movement with at least three levels is formed.

7. The method according to claim 1, wherein the micromechanical part is selected from a group consisting of a bearing, a plate, a slotted bridge and a reduction wheel of a time piece movement.

* * * * *